United States Patent [19]

Kako et al.

[11] Patent Number: 4,803,315

[45] Date of Patent: Feb. 7, 1989

[54] PRINTED CIRCUIT BOARD

[75] Inventors: Mitsumasa Kako, Tokai; Sadashi Hirano, Nagoya, both of Japan

[73] Assignee: Brother Kogyo Kabushiki Kaisha, Nagoya, Japan

[21] Appl. No.: 121,058

[22] Filed: Nov. 16, 1987

[30] Foreign Application Priority Data

Nov. 20, 1986 [JP] Japan .................. 61-277338

[51] Int. Cl.⁴ ............................................ H01H 13/14
[52] U.S. Cl. ...................... 200/5 A; 200/600; 341/37
[58] Field of Search ............ 340/365 C; 200/5 A, 200/52 R, 292, DIG. 1; 361/288

[56] References Cited

U.S. PATENT DOCUMENTS 3,921,167 11/1975 Fox ............................ 340/365 C
3,951,250 4/1976 Pointon et al. ............... 340/365 CX
4,659,879 4/1987 Hasegawa ..................... 200/5 A

FOREIGN PATENT DOCUMENTS

60-117512 6/1985 Japan .

Primary Examiner—A. D. Pellinen
Assistant Examiner—Morris Ginsburg
Attorney, Agent, or Firm—Dennison, Meserole, Pollack & Scheiner

[57] ABSTRACT

A printed circuit board comprising a dielectric film substrate and a plurality of circuit patterns for a capacitor switch formed on said dielectric film substrate at a certain space from each other. Each of the circuit patterns comprises a switch electrode pair formed on one surface of the dielectric film substrate, a first fixed electrode connected to one of the switch electrode pair, a first lead pattern connected to the other of the switch electrode pair, a second fixed electrode formed on the other surface of the dielectric film substrate in such a manner as to be opposed to the first fixed electrode through the dielectric film substrate, said first and second fixed electrodes forming a fixed electrode pair, and a second lead pattern connected to the second fixed electrode. A plurality of the fixed electrode pairs are arranged at an enlarged space larger than the certain space defined between the circuit patterns, and the density of the first and second lead patterns disposed in the enlarged space is reduced.

14 Claims, 6 Drawing Sheets

PRINTED CIRCUIT BOARD

BACKGROUND OF THE INVENTION

The present invention relates to an improved printed circuit board, and more particularly to a printed circuit board for a capacitor keyboard.

Figure 11:
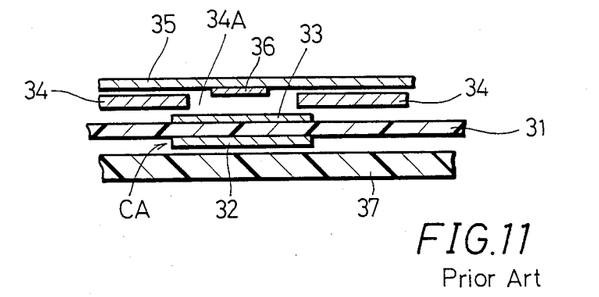
FIG. 11 is a vertical sectional view of the printed circuit board in the prior art.

FIG. 11 shows a sectional view of the structure of the conventional printed circuit board for a capacitor keyboard. A dielectric film substrate 31 is located on a base board 37, and lower and upper capacitor electrodes 32 and 33 are disposed on both surfaces of the dielectric film substrate 31 at a desired position. Thus, the lower and upper capacitor electrodes 32 and 33 and the dielectric film substrate 31 form a capacitor CA having a desired capacitance. A spacer 34 having an aperture 34A is located on the dielectric film substrate 31 in such a manner that the aperture 34A is opposed to the upper capacitor electrode 33. A movable film 35 having a contact 36 is located on the spacer 34 in such a manner that the contact 36 is opposed in spaced relationship to the upper capacitor electrode 33 through the aperture 34A of the spacer 34. When the movable film 35 at the position of the contact 36 is depressed, the contact 36 is brought into contact with the upper electrode 33 to allow a charge in the capacitor CA to be discharged.

Such a capacitor keyboard switch having a dielectric film substrate, capacitor electrodes formed on both surfaces of the dielectric film substrate, and a switching movable electrode arranged in opposed relationship to the capacitor electrodes is disclosed in Japanese Patent Laid-Open Publication No. 60-117512, and U.S. Pat. Nos. 4,659,879 and 3,951,250, for example.

As described above, the conventional capacitor keyboard has a structure such that the lower electrode 32 and the upper electrode 33 are formed on both surfaces of the dielectric film substrate 31, and the contact 36 of the movable film 35 is opposed in spaced relationship to the upper electrode 33 through the aperture 34A of the spacer 34, so as to be made contactable with the upper electrode 33. However, it is necessary to make a pitch between the adjacent switches coincident with a dimension defined by the International Standard of a keyboard (ISO Standard). Accordingly, the mounting position of the capacitor electrode pairs 32 and 33 is limited, and the distance therebetween is resultantly fixed. As a result, lead patterns formed to pass between the adjacent capacitor electrode pairs are closely arranged, causing the generation of cross talk or noise trouble.

SUMMARY OF THE INVENTION

It is an object of the present invention to provide a printed circuit board which can prevent the cross talk and the noise trouble due to the high-density arrangement of the lead pattern.

According to the present invention, there is provided a printed circuit board comprising a dielectric film substrate, and a plurality of circuit patterns for a capacitor switch formed on the dielectric film substrate at a certain space from each other, each of the circuit patterns comprising a switch electrode pair formed on one surface of the dielectric film substrate, a first capacitor electrode connected to one of the switch electrode pair, a first lead pattern connected to the other of the switch electrode pair, a second capacitor electrode formed on the other surface of the dielectric film substrate in such a manner as to be opposed to the first capacitor electrode through the dielectric film substrate, said first and second capacitor electrodes forming a capacitor electrode pair, and a second lead pattern connected to the second capacitor electrode, wherein a plurality of the capacitor electrode pairs are arranged at an enlarged space larger than the certain space defined between the circuit paterns, and the density of the first and second lead patterns disposed in the enlarged space is reduced.

In some modes of the present invention, the enlarged space is defined between adjacent capacitor electrode pairs by making the shapes of the capacitor electrode pairs different from each other. Alternatively, the enlarged space is defined by arranging the capacitor electrode pairs irregularly with respect to the matrix-like key arrangement.

In the present invention, each capacitor electrode pair is arranged separately from each switch electrode pair. That is, the capacitor electrode pair connected to the switch electrode pair is formed aside the switch electrode pair.

With this arrangement, the first and second capacitor electrodes may be arranged without the positional limitation due to the switch electrode pair. Further, as the shape of the first and second capacitor electrodes is changeable with the areas (capacitance) thereof remaining equal to each other, thereby ensuring the space for passing the lead pattern between the adjacent capacitor electrode pairs.

According to the other aspect of the present invention, each pair of capacitor electrodes may be formed on one surface of a substrate. In this aspect, one electrode of each capacitor electrode pair is formed on the substrate, the one capacitor electrode is covered with an insulator layer and the other electrode of each capacitor electrode pair is formed on the insulator layer so as to form a capacitor. In the case of this capacitor structure, the capacitor electrode pair may be formed aside the switch electrode pair and the capacitor electrode pair may be arranged without the positional limitation so as to enlarge the space between adjacent capacitor electrode pairs, too.

The invention will be more fully understood from the following detailed description and appended claims when taken with the drawings.

DETAILED DESCRIPTION OF THE PREFERRED EMBODIMENTS

Referring to FIGS. 1 to 10 which show some preferred embodiments of the present invention, reference numeral 1 designates a printed circuit board for a keyboard of a typewriter and a word processor, for example. The printed circuit board 1 is formed by a dielectric film substrate 2 extending under the keyboard and formed of polyethylene terephthalate, for example. There are formed on the dielectric film substrate 2 a plurality of capacitors C1 to C3, switch electrode pairs 5A and 5B for switches and wirings 6 having a desired shape. Although a part of the printed circuit board 1 is shown for the simplicity of explanation, the other parts are formed similarly.

Figure 1:
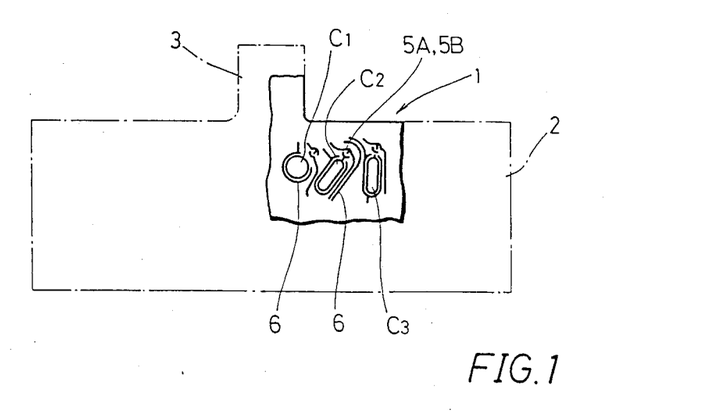
FIG. 1 is a top plan view of the printed circuit board as partially shown in a first preferred embodiment of the present invention.
Figure 2:
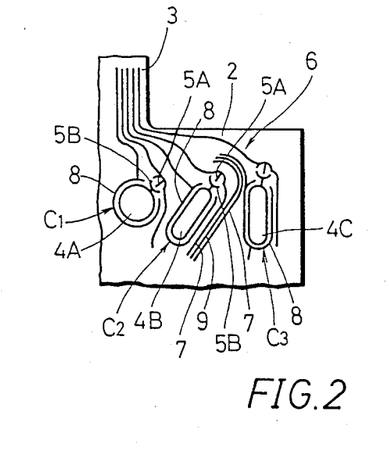
FIG. 2 is an enlarged view of FIG. 1.

Referring to FIG. 2 which shows an enlarged view of FIG. 1, there are formed on the upper surface of the dielectric film substrate 2 first capacitor electrodes 4A, 4B and 4C forming the capacitors C1, C2 and C3, respectively, and first lead patterns 7. The first lead patterns 7 are electrically connected to one side of switch electrode pairs 5A. The first capacitor electrodes 4A, 4B and 4C are adapted to be electrically connected to the other side of switch electrode pairs 5B. The first capacitor electrodes 4A, 4B and 4C are formed to have a dimension or area providing a desired capacitance. In this embodiment, the capacitor electrode 4A has a circular shape having a predetermined area as a basic structure, and the first capacitor electrodes 4B and 4C are of an oblong shape having the same area as of the first capacitor electrode 4A. Instead of such a circular configuration, the present invention may employ any other configurations such as a rectanglar shape. Each lead pattern 6 includes the first lead pattern 7 and a shield pattern 8. The first lead pattern 7 is formed to pass a space defined between the adjacent pattern elements formed by the switch electrode pair 5A and 5B and the first capacitor electrodes 4A, 4B or 4C. Each first lead pattern 7 is collected at a connecting portion 3. The first lead pattern 7 is singly or multiply arranged to pass the space as mentioned above. Each of the first capacitor electrodes 4A, 4B and 4C is surrounded by the shield pattern 8, and the first lead pattern 7 is interposed between the shield patterns 8 or additional shield patterns 9. In the case that a plurality of lead patterns 7 are arranged, they are partitioned by the shield patterns 9, thereby preventing a cross talk between each lead patterns 7 or a noise trouble.

As shown in FIG. 2, the left first capacitor electrode 4A has a fundamental configuration, that is, a circular shape in this embodiment, and the central and right first capacitor electrodes 4B and 4C have an oblong shape of the same area as the first capacitor electrode 4A. A space defined between the oblong capacitor electrodes 4B and 4C is set to be larger than that defined between the circular capacitor electrode 4A and the oblong electrode 4B. The first lead patterns 7 are disposed so as to pass the enlarged space primarily. With this arrangement, the density of the lead patterns 7 can be reduced as compared with the prior art. In this embodiment, a single lead pattern 7 is arranged in the smaller space defined between the capacitor electrodes 4A and 4B, and a plurality of lead patterns 7 are arranged in the larger space defined between the capacitor electrodes 4B and 4C.

Figure 3:
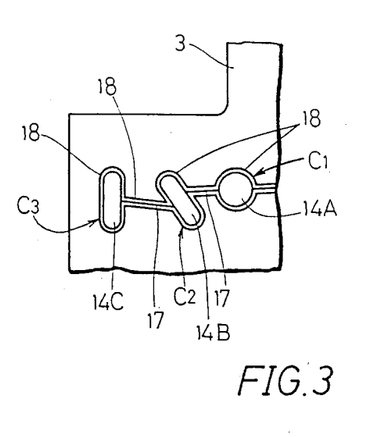
FIG. 3 is a bottom plan view of FIG. 2.

Referring to FIG. 3 which partially shows a bottom plan view of the printed circuit board, second capacitor electrodes 14A, 14B and 14C are arranged on the lower surface of the dielectric film substrate 2 in such a manner as to be opposed to the first capacitor electrodes 4A, 4B and 4C formed on the upper surface of the dielectric film substrate 2, respectively. The second capacitor electrode 14A has the same shape as of the first opposed capacitor electrode 4A. Similarly, the second capacitor electrodes 14B and 14C have the same shape as of the opposed first capacitor electrodes 4B and 4C. In other words, the right second capacitor electrode 14A as seen in FIG. 3 has a circular shape, and the central and left second capacitor electrodes 14B and 14C have an oblong shape. The second capacitor electrodes 14A, 14B and 14C are connected to each other by second lead pattern 17, which are collected at a connecting portion 3. The second capacitor electrodes 14A, 14B and 14C and the second lead patterns 17 are surrounded to be protected by shield pattern 18.

The switch pair electrodes 5A and 5B, the first lead patterns 7, the first capacitor electrodes 4A to 4C and the shield patterns 8 are formed on the upper surface of the dielectric film substrate 2 by etching a conductive metal foil or printing a conductive coating material. Similarly, the second lead patterns 17, the second capacitor electrodes 14A to 14C and the shield patterns 18 are formed on the lower surface of the dielectric film substrate 2 by etching a conductive metal foil or printing a conductive material.

In the printed circuit board 1 according to the present invention, the capacitors C1 to C3 are constructed by the first and second capacitor electrodes 4A to 4C and 14A to 14C and the dielectric film substrate 2 disposed between the first and second capacitor electrodes.

Figure 8:
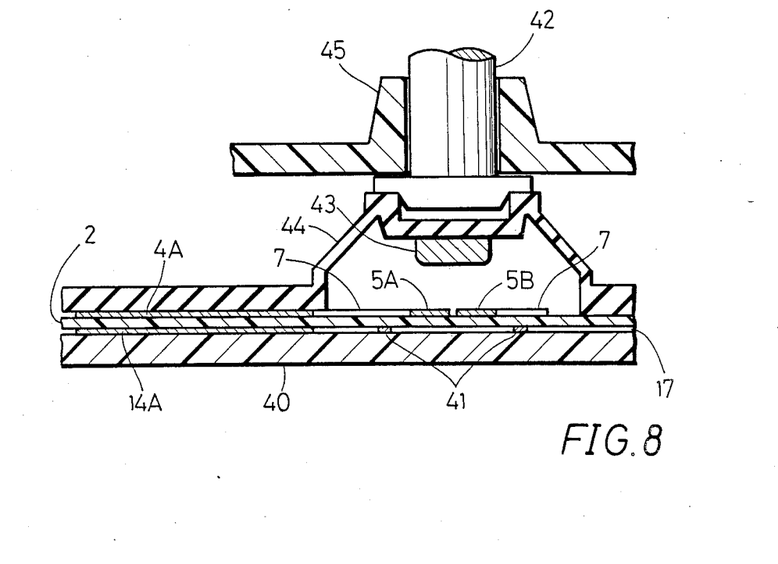
FIG. 8 is a vertical sectional view of a part of the keyboard, of a fifth preferred embodiment.
Figure 9:
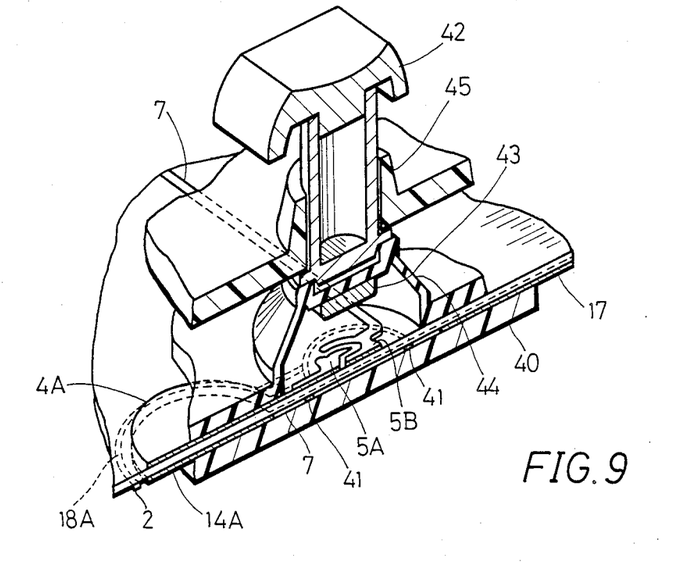
FIG. 9 is a perspective view of FIG. 8.

As will be shown in FIGS. 8 and 9, the switch electrode pairs 5A and 5B are located just under the key 42. When the key 42 is depressed, both the switch electrode pair 5A and 5B are electrically connected with each other, while when the key 42 is undepressed, both the switch electrode pair 5A and 5B are not electrically connected with each other. Then, the printed circuit board 1 is used in the same manner as in the prior art.

Figure 4:
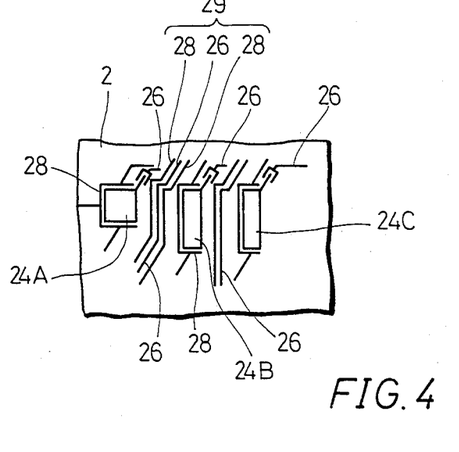
FIG. 4 is an enlarged view similar to FIG. 2, of a second preferred embodiment.

Referring to FIG. 4 which shows another embodiment of the present invention, a first capacitor electrode 24A having a square shape as a basic structure and the other first capacitor electrodes 24B and 24C having a rectangular shape are formed on the dielectric film substrate 2. The square of the capacitor electrode 24A has the same area as of the rectangle of the capacitor electrodes 24B and 24C, and the space defined between the capacitor electrodes 24A and 24B is larger than that defined between the capacitor electrodes 24B and 24C, so that the number of wiring 29 including a first lead pattern 26 and a shield pattern 28 as arranged between the capacitor electrodes 24A and 24B is higher than the number of the wiring 29 arranged between the capacitor electrodes 24B and 24C. The first lead pattern 26 and the shield pattern 28 are arranged in the same manner as in the first preferred embodiment.

Figure 5:
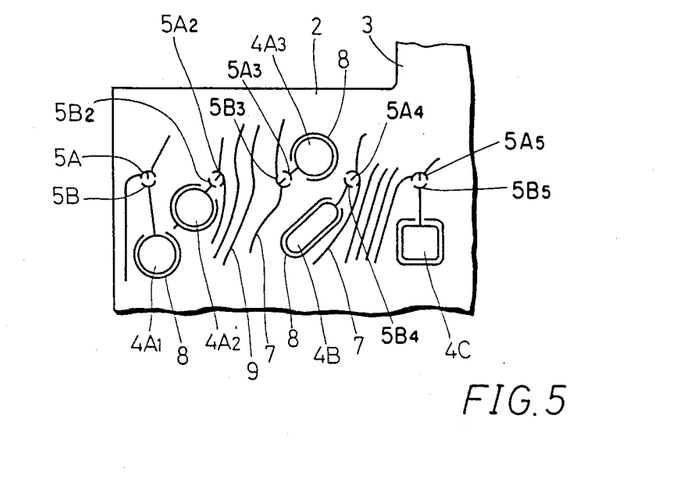
FIG. 5 is a top plan view similar to FIG. 2, of a third preferred embodiment.
Figure 6:
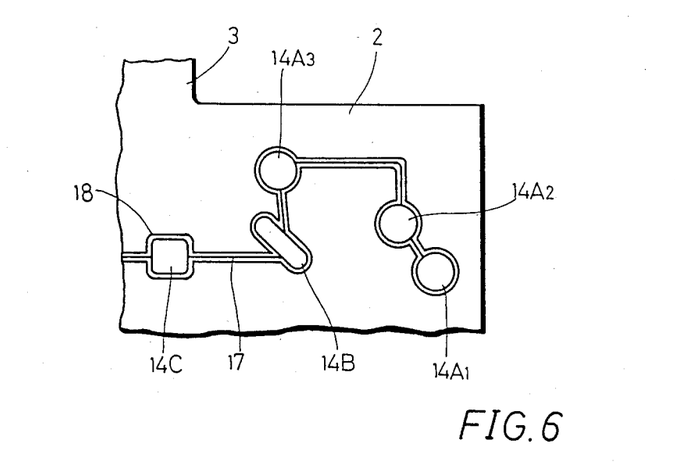
FIG. 6 is a bottom plan view of FIG. 5.

FIGS. 5 and 6 show a third preferred embodiment of the present invention, which correspond to FIGS. 2 and 3 showing the first preferred embodiment. In the third preferred embodiment, the corresponding elements are designated by the same or similar reference numerals as in the first preferred embodiment.

According to the third preferred embodiment, circular first capacitor electrodes $4A_1$, $4A_2$ and $4A_3$ have the same shape, and the first capacitor electrode $4A_3$ is shifted to the opposite direction from the adjacent first capacitor electrode $4A_2$ with respect to switch electrode pair arrangements ($5A_2$, $5B_2$) and ($5A_3$, $5B_3$) to define an enlarged space therebetween. Similarly, a rectangular capacitor electrode 4C is shifted to the opposite direction from an oblong capacitor electrode 4B with respect to switch electrode pair arrangements ($5A_4$, $5B_4$) and ($5A_5$, $5B_5$) to define an enlarged space therebetween.

Figure 7A:
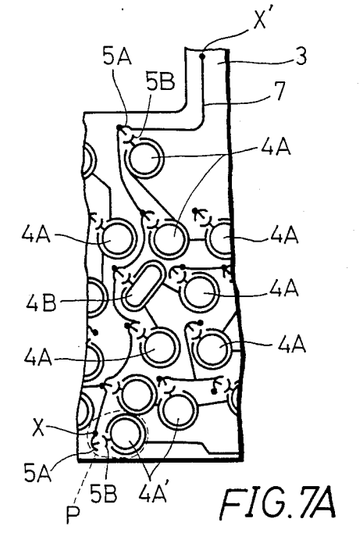
FIG. 7A is a top plan view similar to FIG. 2, of a fourth preferred embodiment.
Figure 7B:
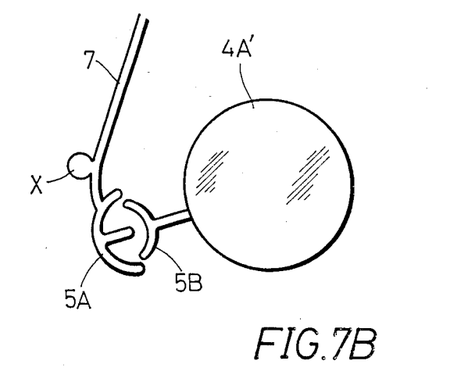
FIG. 7B is an enlarged view of the encircled part P shown in FIG. 7A.

FIGS. 7A and 7B show a fourth preferred embodiment of the present invention, in which the same reference numerals designate the same elements as in the first preferred embodiment. The first lead pattern 7 and the second lead pattern (not shown, but provided on the back surface of the substrate 2) are so arranged as to form a matrix.

In all of the preferred embodiments in the present invention, the first lead pattern 7 on the upper surface of the film 2 extends vertically as shown in FIG. 7A, and is connected to the switch electrode pairs corresponding to the keys vertically arranged on the keyboard, while the second lead pattern 17 on the lower surface of the film 2 extends laterally as shown in FIGS. 3 and 6, and is connected to the second capacitor electrodes corresponding to the keys laterally arranged on the keyboard. As shown in FIGS. 7A and 7B, there are provided in the vicinity of one end of the lead pattern 7 a check terminal X for checking a defect such as break of the lead pattern 7. In this embodiment, the check terminal X is so formed as to outwardly project from the lead pattern 7 as specifically shown in Fig. 7B. That is, prior to installation of the printed circuit board into the keyboard, a check signal is inputted to a terminal X', for example, and it is detected whether or not a predetermined detection signal is outputted from the check terminal X connected to the terminal X'. If the predetermined detection signal is not outputted, it is determined that the line of the circuit pattern is broken. Similar operation is conducted between the other terminals and the other check terminals, so as to check a defect such as break of the circuit pattern.

FIGS. 8 and 9 show a fifth preferred embodiment of the present invention, in which the same reference numerals designate the same elements as in the previous embodiments. According to the fifth preferred embodiment, a chattering prevention pattern 41 is interposed between a dielectric film substrate 2 and a substrate mounting board 40 located under the substrate 2. The chattering prevention pattern 41 is preferably formed in a circular shape such that surrounds switch electrode pair 5A and 5B, and has a thickness equal to that of a second capacitor electrode 14A. The chattering prevention pattern 41 is electrically connected to a shield pattern 18A surrounding the second capacitor electrode 14A. In a switching operation where a key 42 is manually depressed to bring a movable electrode 43 to electrically contact with the switch electrode pair 5A and 5B and thereby effect an on-state, while a depression force applied to the key 42 is released to bring the movable electrode 43 to be moved away from the switch electrode pair 5A and 5B by an elastic force of a rubber spring 44, thereby effecting an off-state, the switch electrode pair 5A and 5B are prevented from unstably moving vertically due to the chattering prevention pattern 41. That is, the upper surface of the switch electrode pair 5A and 5B is always kept at the same level as of the first capacitor electrode 4A due to the chattering prevention pattern 41. Accordingly, the chattering in the switching operation can be prevented. Although the shape of the chattering prevention pattern 41 is circular in the preferred embodiment, any other desirable shapes such as a rectangular shape may be employed. Reference numeral 45 designates a guide member for guiding a stem portion of the key 42.

Figure 10A:
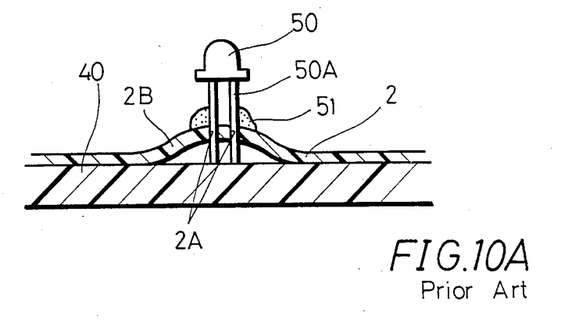
FIG. 10A is a vertical sectional view of the printed circuit board in the prior art, mounting LED.
Figure 10B:
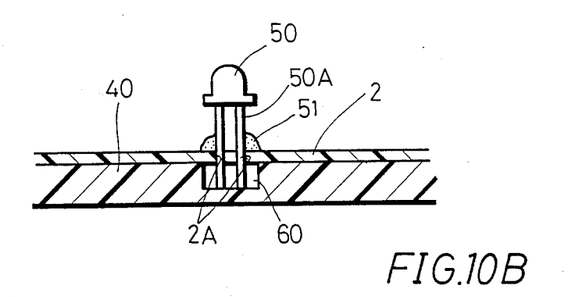
FIG. 10B is a vertical sectional view of a sixth preferred embodiment, similar to FIG. 10A.

FIG. 10B shows a sixth preferred embodiment of the present invention, and FIG. 10A shows a prior art construction corresponding to FIG. 10B. Referring to FIG. 10A which shows a mounted condition where an element such as LED 50 is mounted to a pattern terminal, legs 50A of the LED 50 are pierced through insertion holes 2A of a substrate 2, and they are then fixed to the substrate 2 by soldering 51. In the case that the substrate 2 is a film substrate, the legs 50A of the LED 50 are pierced through the insertion holes 2A, so as to be firmly fixed to the substrate 2. In this case, the substrate 2 is raised by the legs 50A to disadvantageously form a waving portion 2B.

The preferred embodiment shown in FIG. 10B solves the above problem by forming a recess 60 in the substrate mounting board 40 for receiving the legs 50A of the LED 50. With this construction, even when the legs 50A are pierced through the film substrate 2, and are fixed thereto, the above-mentioned waving portion 2B of the substrate 2 is prevented from being generated.

Figure 12:
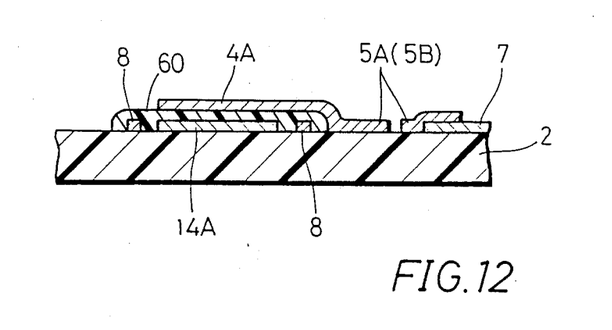
FIG. 12 is a vertical sectional view of a seventh preferred embodiment of the present invention.

Referring to FIG. 12 which shows a seventh preferred embodiment of the present invention, the circuit patterns are formed on only one surface of a substrate 2 rather than on both surfaces thereof as mentioned in the previous embodiments. The substrate 2 may be a rigid substrate or a film substrate. A first capacitor electrode 14A is formed on the substrate 2 by etching a copper foil or the like or printing a conductive coating such as carbon, copper and silver paste thereon. A shield pattern 8 is formed on the substrate 2 in such a manner as to surround the first capacitor electrode 14A. An insulator layer 60 is formed so as to cover the first capacitor electrode 14A and the shield pattern 8. The insulator layer 60 is formed of a usually available insulating coating material such as an epoxy resin coating material. A second capacitor electrode 4A is formed on the insulator layer 60 in opposed relationship to the first capacitor electrode 14A. A switch electrode pair has a first electrode 5A connected to the second capacitor electrode 4A and a second electrode 5B connected to a lead pattern 7 formed on the substrate 2. As shown, the switch electrode pair 5A and 5B is formed on the substrate 2. The second capacitor electrode 4A and the switch electrode pair 5A and 5B are formed by printing the aforementioned conductive coating material.

Figure 13:
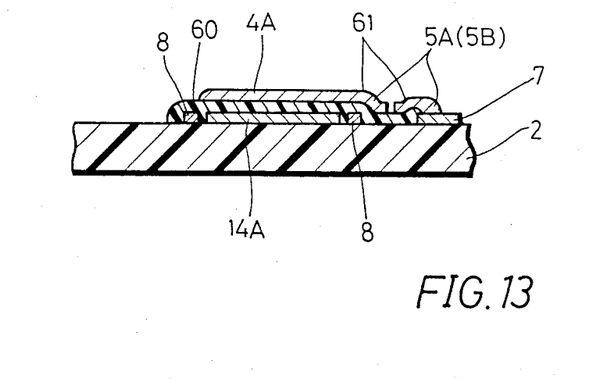
FIG. 13 is a vertical sectional view of an eighth preferred embodiment similar to FIG. 12.

FIG. 13 shows an eighth preferred embodiment. In this embodiment, the insulator layer 60 extends to the switch electrode pair 5A and 5B in such a manner that the switch electrode pair 5A and 5B are formed on the insulator layer 60. With this arrangement of this embodiment, the switch electrode pair 5A and 5B is less formed with stepped edges 61 as compared with the embodiment shown in FIG. 12 since the insulator layer 60 is interposed between the switch electrode pair 5A and 5B and the substrate 2. Accordingly, the thickness of the switch electrode pair 5A and 5B may be made uniform.

Having thus described the preferred embodiments of the invention, it should be understood that numerous structural modifications and adaptations may be made without departing from the spirit of the invention.

What is claimed is:

1. A printed circuit board for a keyboard which has a plurality of keys substantially arranged along rows and columns so as to form a matrix-like key arrangement, comprising:

a dielectric film having opposite first and second surfaces and extending under the keyboard;

a plurality of first capacitor electrodes formed on said first surface of said dielectric film, each of said first capacitor electrodes having a predetermined area;

a plurality of switch electrode pairs formed on said first surface of said dielectric film, wherein a location of each of said switch electrode pairs corresponds to a location of each key, and each of said switch electrode pairs is connected to each other when a corresponding key is depressed, and each of said switch electrode pairs is disconnected to each other when the corresponding key is not depressed, and one side of each of said switch electrode pairs is connected to each of said first capacitor electrodes;

a plurality of first lead patterns formed on said first surface of said dielectric film, wherein each of said first lead patterns is connected to the other side of said switch electrode pairs;

a plurality of second capacitor electrodes formed on said second surface of said dielectric film and arranged in such a manner that each of said second capacitor electrodes opposes to each of said first capacitor electrodes whereby a pair of opposing said first and second capacitor electrodes form a capacitor; and a plurality of second lead patterns formed on said second surface of said dielectric film, wherein said second lead patterns are connected to said second capacitor electrodes; wherein a plurality of said pairs of said first and second capacitor electrodes are arranged in such a manner that a space defined by adjacent said pairs is enlarged more than a hypothetical space to be defined by adjacent hypothetical capacitor electrode pairs if the same had the same shape and were arranged regularly with respect to the matrix-like key arrangement.

2. The printed circuit board as defined in claim 1, wherein said first and second lead patterns are arranged to pass through said enlarged space.

3. The printed circuit board as defined in claim 2, wherein said enlarged space is defined by making shapes of said capacitor electrode pairs different from each other.

4. The printed circuit board as defined in claim 2, wherein said enlarged space is defined by arranging said capacitor electrode pairs irregularly with respect to the matrix-like key arrangement.

5. The printed circuit board as defined in claim 4, wherein said enlarged space is defined by shifting adjacent capacitor electrode pairs in opposite directions with respect to the matrix-like key arrangement.

6. The printed circuit board as defined in claim 2, wherein said first lead patterns are arranged along either one direction of the column or the row in the matrix-like key arrangement, and each of said first lead patterns is connected to said other side of said switch electrode pairs arranged along said one direction in the matrix-like key arrangement, and wherein said second lead patterns are arranged along the other direction of said first patterns in the matrix-like key arrangement, and each of said second lead patterns is connected to said second capacitor electrodes arranged along said other direction in the matrix-like key arrangement.

7. The printed circuit board as defined in claim 6 further comprising check terminals formed in the vicinity of one end of each of said first and second lead patterns respectively for checking break of said lead patterns.

8. The printed circuit board as defined in claim 7, wherein said terminals project outwardly from said first lead patterns.

9. The printed circuit board as defined in claim 2, further comprising chattering prevention patterns provided on said second surface of said dielectric film and having a thickness equal to that of said second capacitor electrodes for preventing chattering of said switch electrode pairs upon depression and undepression of a key.

10. The printed circuit board as defined in claim 9, wherein each of said chattering prevention patterns has a circular shape such as to surround said switch electrode pair.

11. The printed circuit board as defined in claim 2 further comprising an electronic element having a leg portion and a mounting board for mounting said dielectric film having a recess for receiving said leg portion, wherein said electronic element is mounted to said dielectric film under the condition where said leg portion pierces through said dielectric film and is received in said recess so as to prevent waving of said dielectric film.

12. A printed circuit board for a keyboard which has a plurality of keys substantially arranged along rows and columns so as to form a matrix-like key arrangement, comprising:

a substrate having a top surface and extending under said keyboard;

a plurality of first capacitor electrodes formed on said top surface of said substrate, each of said first capacitor electrodes having a predetermined area;

an insulator layer covering at least said first capacitor electrodes;

a plurality of second capacitor electrodes formed on said insulator layer and arranged in such a manner that each of said second capacitor electrodes opposes to each of said first capacitor electrodes whereby a pair of opposing said first and second capacitor electrodes form a capacitor;

a plurality of switch electrode pairs, wherein a location of each of said switch electrode pairs corresponds to a location of each key, and each of said switch electrode pairs is connected to each other when a corresponding key is depressed, and each of said switch electrode pairs is disconnected to each other when the corresponding key is not depressed and one side of each of said switch electrode pairs is connected to each of said second capacitor electrodes; and a plurality of lead patterns formed on said top surface of said substrate, wherein each of said lead patterns is connected to the other side of said switch electrode pairs; wherein a plurality of said pairs of said first and second capacitor electrodes are arranged in such a manner that a space defined by adjacent said pairs is enlarged more than a hypothetical space to be defined by adjacent hypothetical capacitor electrode pairs if the same had the same shape and were arranged regularly with respect to the matrix-like key arrangement.

13. The printed circuit board as defined in claim 12, wherein said switch electrode pairs are formed on said substrate.

14. The printed circuit board as defined in claim 12, wherein said switch electrode pairs are formed on said insulator layer.

* * * * *